(12) United States Patent
Park

(10) Patent No.: US 6,743,665 B2
(45) Date of Patent: Jun. 1, 2004

(54) METHOD FOR FORMING ISOLATION LAYER IN SEMICONDUCTOR DEVICE

(75) Inventor: Cheol Soo Park, Kyoungki-do (KR)

(73) Assignee: Dongbu Electronics Co., Ltd., Seoul (CN)

( * ) Notice: Subject to any disclaimer, the term of this patent is extended or adjusted under 35 U.S.C. 154(b) by 0 days.

(21) Appl. No.: 10/322,849

(22) Filed: Dec. 18, 2002

(65) Prior Publication Data

US 2003/0119266 A1 Jun. 26, 2003

(30) Foreign Application Priority Data

Dec. 20, 2001 (KR) ................. 10-2001-0081811

(51) Int. Cl.7 .............................................. H01L 21/00
(52) U.S. Cl. ........................ 438/149; 438/637; 257/510
(58) Field of Search ................... 438/637–639, 438/294–297, 362, 363, 149, 439; 257/510–513

(56) References Cited

U.S. PATENT DOCUMENTS 6,228,691 B1 * 5/2001 Doyle .................. 438/149
6,277,723 B1    8/2001 Shih et al.
6,303,467 B1   10/2001 Jen et al.

* cited by examiner

*Primary Examiner*—Dung A. Le
(74) *Attorney, Agent, or Firm*—Timothy J. Keefer; Seyfarth Shaw, LLP

(57) ABSTRACT

Disclosed is a method for forming an isolation layer in a semiconductor device, in which when a masking insulation layer and an isolation oxide layer are sequentially subjected to a dry etching process in accordance with an isolation mask pattern, the isolation oxide layer is etched to have a thickness of approximately hundreds of angstroms from the top surface of the silicon substrate, thereby preventing the silicon substrate from being damaged by plasma. Therefore, reliability of the device can be improved. To this end, the method comprises the steps of forming an isolation oxide layer and a masking insulation layer on an silicon substrate in order; etching the masking insulation layer and the isolation oxide to form a trench; and growing an epitaxial silicon layer in the trench to form an epitaxial silicon active area.

2 Claims, 4 Drawing Sheets

METHOD FOR FORMING ISOLATION LAYER IN SEMICONDUCTOR DEVICE

BACKGROUND OF THE INVENTION

1. Field of the Invention

The present invention relates to a method for forming an isolation layer in a semiconductor device, and more particularly to a method for forming an isolation layer using epitaxial silicon growth.

2. Description of the Prior Art

In general, as the degree of integration in semiconductor devices becomes higher and higher, new research is conducted into an isolation process using trench etching and chemical mechanical polishing (CMP) processes instead of the existing local oxidation of silicon (LOCOS).

One embodiment of a method for forming an isolation layer according to the prior art will be described below in reference with FIGS. 1 and 2.

First, as shown in FIG. 1, a pad oxide layer 2 and a nitride layer 3 are formed in turn on a silicon substrate 1, and then patterned together in a predetermined size to expose the silicon substrate 1. The exposed silicon substrate 1 is etched to form a trench.

Subsequently, as shown in FIG. 2, the trench formed in the silicon substrate 1 is filled with an oxide layer 4. The resulting structure is, in turn, subjected to a CMP process, a cleaning process, and a formation process of a sacrificial oxide layer.

However, in the method for forming a trench isolation layer as mentioned above, the oxide layer filled into the trench has a cutout edge A, a so-called trench edge, due to an anisotropy of the oxide layer. This trench edge causes various remnants to remain therein during etching of a word-line, which hinders the device from operating stably. Due to a fringing electric field generated at the trench edge, a transistor hump takes place, and thereby increasing a sub-threshold current In addition, an inverse narrow width effect is generated to deteriorate a property of the device.

Another embodiment of a method for solving these problems by forming an isolation layer according to the prior art is shown in FIGS. 3 to 5.

First, referring to FIG. 3, a pad oxide layer 12 and a nitride layer 13 are formed in turn on a silicon substrate 11, and then patterned together in a predetermined size to expose the silicon substrate 11. The exposed silicon substrate 11 is etched to form a trench. In this case, the silicon substrate 11 is etched in a step shape using remnants generated during a formation of the trench in the silicon substrate 11.

Then, as shown in FIG. 4, an oxidation process is preformed to form an oxide layer 14, by which a corner of the trench of the silicon substrate 11 is rounded off.

Subsequently, as shown in FIG. 5, the trench is filled with an oxide layer 15. The resulting structure is subjected to a CMP, and thus an isolation layer with a round profile is formed along the edge of the trench.

In contrast, another conventional method is dependent on a pattern size. Specifically, it is easy for a wide pattern to form such a step, while it is difficult for a narrow pattern such as in a highly integrated dynamic random access memory (DRAM) to form such a step. Therefore, there is a high possibility of the generation of defects, for example, the cutout edge A of the oxide layer may cause an electric property of the device to deteriorate. Further, when the trench is formed, a change in the step shape depending on the pattern size has an influence on an electric property of the device. Moreover, there is a problem in that when the trench is formed, a thermal oxide layer is formed to remove the cutout oxide layer and to round off the corner of the trench, and then a sacrificial oxidation process is performed to remove the thermal oxide layer, the corner of the trench becomes weaker.

SUMMARY OF THE INVENTION

Accordingly, the present invention has been made to solve the above-mentioned problems occurring in the prior art, and an object of the present invention is to provide a method for forming an isolation layer in a semiconductor device using an etching process for forming a trench, in which no loss is generated at a corner of an isolation insulation layer filled into the trench, and no remnant is generated in the following process, thereby obtaining a stable electric property of the device.

Another object of the present invention is to provide a method for forming an isolation layer in a semiconductor device, in which when a masking insulation layer and an isolation oxide layer are sequentially subjected to a dry etching process in accordance with an isolation mask pattern, the isolation oxide layer is etched to have a thickness within hundreds of angstroms from the top surface of the silicon substrate, thereby preventing the silicon substrate from being damaged by plasma. Therefore, reliability of the device can be improved.

To accomplish these objects, there is provided a method for forming an isolation layer in a semiconductor device, comprising the steps of;

forming in turn an isolation oxide layer, a masking insulation layer and a mask pattern on an silicon substrate;

etching the masking insulation layer and then the isolation oxide layer in part by a dry etching process in accordance with the mask pattern, the isolation oxide layer being etched to have a predetermined thickness;

removing the mask pattern and then completely removing the isolation oxide layer having a predetermined thickness on the silicon substrate to form a trench; and growing an epitaxial silicon layer on the resultant to form an epitaxial silicon active area.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
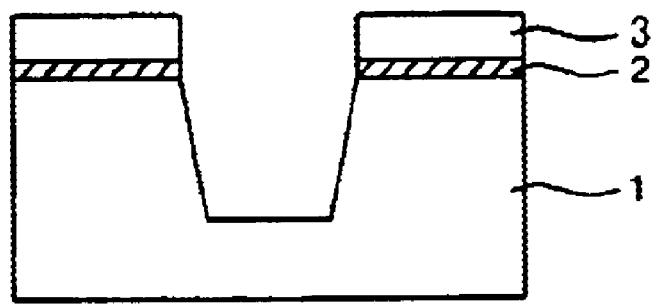
FIGS. 1 and 2 are cross-sectional views illustrating one embodiment of a method for forming an isolation layer according to the prior art.
Figure 2:
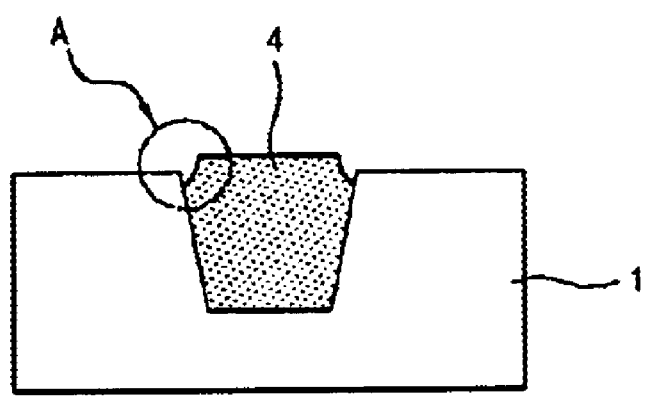
Figure 3:
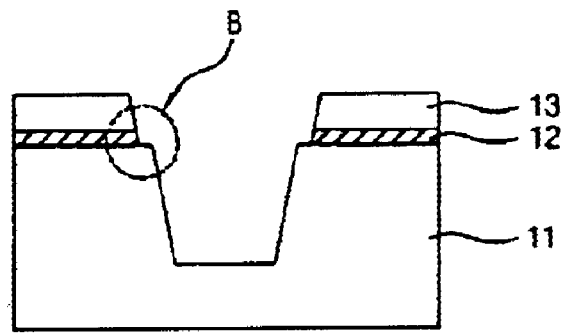
FIGS. 3 to 5 are cross-sectional views illustrating another embodiment of a method for forming an isolation layer according to the prior art.
Figure 4:
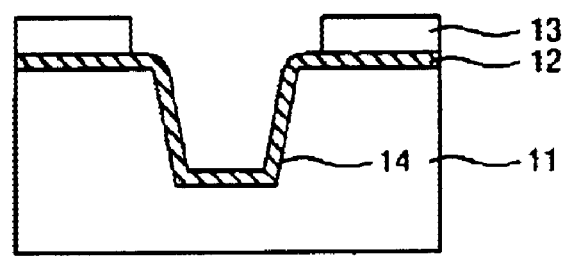
Figure 5:
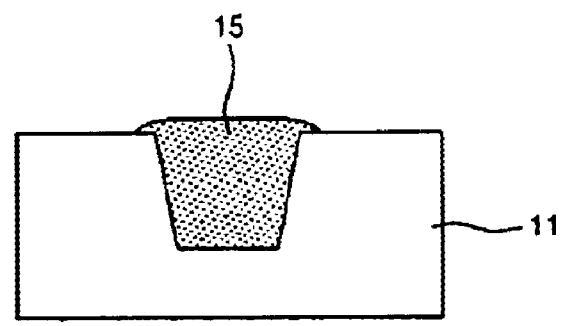

Hereinafter, preferred embodiments of the present invention will be described with reference to the accompanying drawings. In the following description and drawings, the same reference numerals are used to designate the functionally same or similar components, and so repetition of the description on the same or similar components will be omitted.

Figure 6:
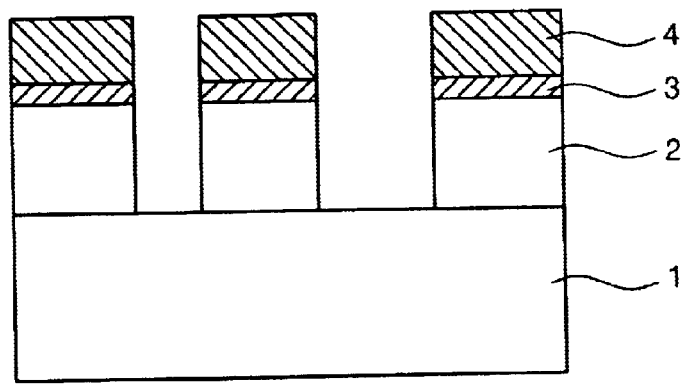
FIGS. 6 to 8 are cross-sectional views illustrating one embodiment of a method for forming an isolation layer in a semiconductor device according to the present invention.
Figure 7:
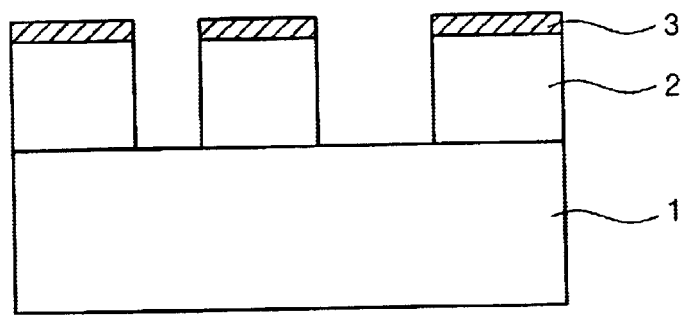
Figure 8:
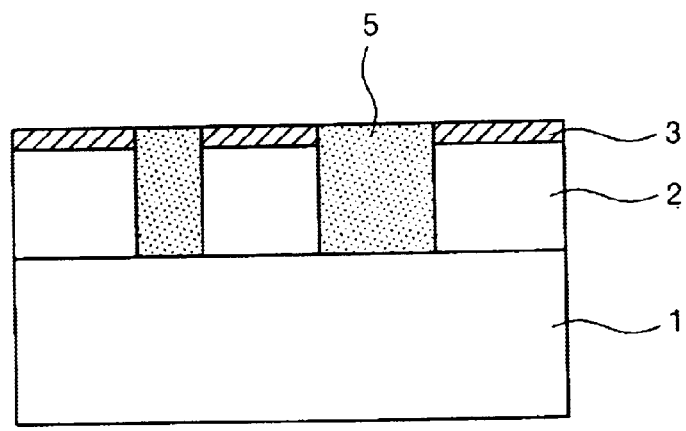

FIGS. 6 to 8 are cross-sectional views illustrating one embodiment of a method for forming an isolation layer in a semiconductor device according to the present invention.

First, referring to FIG. 6, an isolation oxide layer 2 is thermally grown on a silicon substrate 1 to a desired thickness. A masking insulation layer 3 is deposited on the isolation oxide layer 2. An isolation mask pattern 4 is formed on the masking insulation layer 3.

Then, the isolation oxide layer 2 and the masking insulation layer 3 are subjected to a dry etching so as to expose the silicon substrate 1 corresponding to the isolation mask pattern 4.

Subsequently, the isolation mask pattern 4 is removed. (see FIG. 7)

Referring to FIG. 8, an active silicon area 5 is created by an epitaxial growth to become an active area and a field area.

Figure 9:
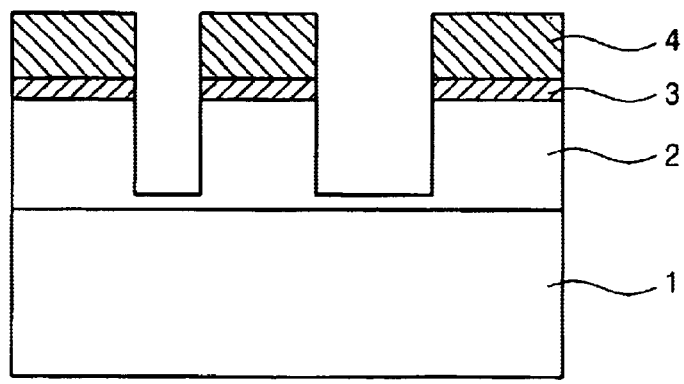
FIGS. 9 to 11 are cross-sectional views illustrating another embodiment of a method for forming an isolation layer in a semiconductor device according to the present invention.
Figure 10:
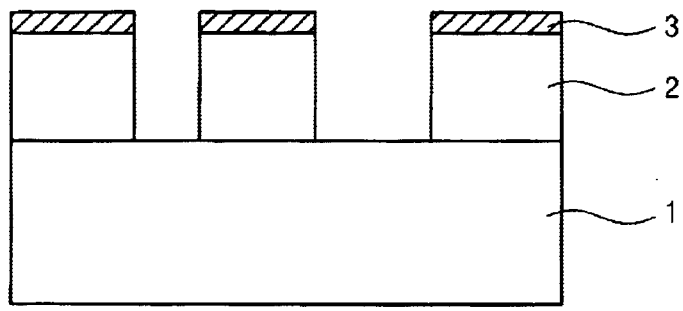
Figure 11:
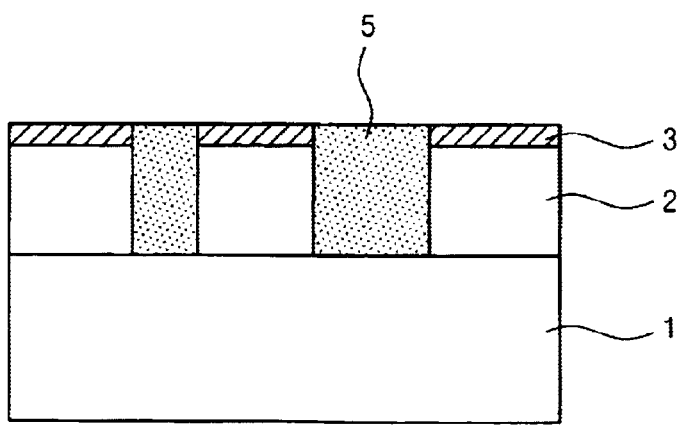

FIGS. 9 to 11 are cross-sectional views illustrating another embodiment of a method for forming an isolation layer in a semiconductor device according to the present invention.

First, referring to FIG. 9, an isolation oxide layer 2 is thermally grown on a silicon substrate 1 to a desired thickness. A masking insulation layer 3 is deposited on the isolation oxide layer 2. An isolation mask pattern 4 is formed on the masking insulation layer 3.

The masking insulation, layer 3 and the isolation oxide layer 2 in that order are then subjected to a dry etching process in accordance with the isolation mask pattern 4. In this case, the isolation oxide layer 2 must be etched to leave a thickness of approximately hundreds of angstroms from the top surface of the silicon substrate 1. This is not only to prevent the silicon substrate 1 from being damaged by plasma, but also to decrease defects which are generated between the silicon substrate 1 and an epitaxial layer formed into an active area in future. This epitaxial layer is formed during an epitaxial silicon growth.

Subsequently, Referring to FIG. 10, the isolation mask pattern 4 is removed, and then the left isolation oxide layer 2 is completely removed from the silicon substrate 1.

Finally, referring to FIG. 11, an active silicon area 5 is created by an epitaxial silicon growth to become an active area and a field area.

As described above, in the method for forming isolation layer in a semiconductor device according to the present invention, when the masking insulation layer 3 and the isolation oxide layer 2 are sequentially subjected to a dry etching process in accordance with the isolation mask pattern 4, the isolation oxide layer 2 is etched to leave a thickness of approximately hundreds of angstroms from the top surface of the silicon substrate 1, thereby preventing the silicon substrate 1 from being damaged by plasma. Therefore, reliability of the device can be improved.

In addition, during an epitaxial silicon growth, defects generated between an epitaxial layer and the silicon substrate 1 can be decreased.

Although preferred embodiments of the present invention have been described for illustrative purposes, those skilled in the art will appreciate that it is possible for various modifications, additions and substitutions to be made, without departing from the scope and spirit of the invention as disclosed in the accompanying claims.

What is claimed is:

1. A method for forming an isolation layer in a semiconductor device, comprising the steps of:
   providing a silicon substrate;
   forming a isolation oxide layer on said silicon substrate;
   forming a masking insulation layer on said isolation oxide layer and said silicon substrate;
   forming a trench by etching said masking insulation layer and said isolation oxide layer, wherein a portion of the isolation oxide layer remains within the trench on said silicon substrate;
   removing the portion of the isolation oxide layer by using wet etching process; and
   growing an epitaxial silicon layer in the trench to form an epitaxial silicon active area.

2. The method as claimed in claim 1, wherein the portion of the isolation oxide layer that remains within the therein has a thickness of approximately hundreds of angstroms from the top surface of the silicon substrate.

* * * * *